United States Patent

[11] 3,601,625

[72] Inventors Donald J. Redwine;
Earl M. Worstell, Jr., both of Houston, Tex.
[21] Appl. No. 836,266
[22] Filed June 25, 1969
[45] Patented Aug. 24, 1971
[73] Assignee Texas Instruments Incorporated
Dallas, Tex.

[54] MOSIC WITH PROTECTION AGAINST VOLTAGE SURGES
6 Claims, 5 Drawing Figs.

[52] U.S. Cl. .................................................. 307/202, 307/303, 307/304, 307/318, 317/235 G
[51] Int. Cl. .................................................. H03k 3/35
[50] Field of Search .................................................. 330/35; 307/202, 303, 304, 213; 317/235, 22.2

[56] References Cited
UNITED STATES PATENTS

| | | | |
|---|---|---|---|
| 3,466,511 | 9/1969 | Lin .............................. | 307/303 X |
| 3,470,390 | 9/1969 | Lin .............................. | 307/304 X |
| 3,474,347 | 10/1969 | Praglin et al. ................. | 330/35 X |
| 3,512,058 | 5/1970 | Khajezadeh et al. ........... | 317/235 |

OTHER REFERENCES

Richman, Characteristics and Operation of Mos Field-Effect Devices McGraw Hill 1967 pp. 77–79 317-235/21.1

*Primary Examiner*—Roy Lake
*Assistant Examiner*—James B. Mullins
*Attorneys*—James O. Dixon, Andrew M. Hassell, Harold Levine, Melvin Sharp, John E. Vandigriff, Henry T. Olsen and Michael A. Sileo, Jr.

ABSTRACT: A circuit for protecting a metal-insulator semiconductor integrated circuit (MOSIC) against voltage surges is described. The circuit utilizes a diffused PN junction connected between the gate of an input MOS transistor and the source voltage in such a manner that the control voltage applied to the gate reverse biases the PN junction, which then functions as a Zener diode. The circuit may include a diffused resistance between the gate and the source voltage, or between the gate and an input terminal to protect either the diode, or the gate, or both against heavy current levels. Two or more diodes can be connected back to back to provide a higher breakdown voltage and permit higher control voltage signals to be used.

PATENTED AUG 24 1971 3,601,625

INVENTORS
DONALD J. REDWINE
EARL M. WORSTELL, JR.

MOSIC WITH PROTECTION AGAINST VOLTAGE SURGES

This invention relates generally to semiconductor integrated circuits, and more particularly relates to metal-insulator semiconductor integrated circuits.

The logic inputs to a metal-insulator semiconductor integrated circuit (MOSIC) are nearly always connected to the gate of one or more MOS transistors. Each of the gates forms one plate, the oxide the dielectric, and the substrate the other plate of a capacitor. In order to provide an operative field effect device it is necessary for the insulating layer to be very thin, typically on the order of 1,200 angstroms. Further, the input transistors are purposely made as small as practical in order to reduce the input capacitance of the device. MOS transistors inherently require relatively high operating voltages. Thus, any spike or surge in the input voltage may break down the thin insulating layer, short the transistor, and destroy the entire integrated circuit. Failures of once operative MOSIC's have been traced to static electricity, for example.

MOSIC's are typically fabricated on an N-type substrate by making a set of P-type diffusions to form source and drain regions for the MOS transistors, one plate of any capacitors, resistors, or second level interconnections. The insulating layer, typically silicon oxide although other insulators such as silicon nitride may be used, is made thin, where MOS transistor channels are to be formed and opened where contact with the diffused regions is required. Metal conductors are then placed on the insulating layer to form the gates of the MOS transistors, other plates of the capacitors, and leads interconnecting the circuit.

This invention is concerned with a circuit for protecting the input components of an MOSIC. In accordance with the present invention, a second diffusion of the same conductivity type as the substrate is made into one or more diffusions of the same conductivity type used to form the source and drain regions of the MOS transistors. The PN junction thus formed between the two diffused regions is then connected between the circuit to be protected and the substrate in such a manner as to be reverse biased by the input voltage. The Zener breakdown voltage of the PN junction then maintains the necessary voltage level for operation of the MOSIC, yet protects the circuit from excessive voltage surges. More than one PN junction can be connected in series so as to increase the Zener breakdown level. The circuit in accordance with the present invention also contemplates one or more current limiting resistances.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
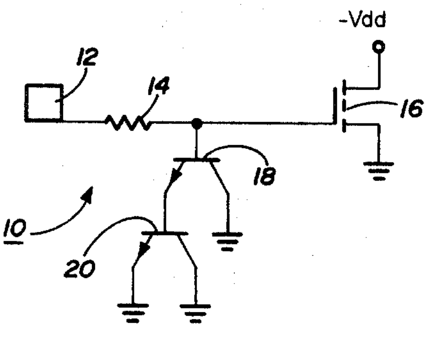
FIG. 1 is a schematic circuit diagram illustrating one embodiment of the present invention.

Referring now to the drawings, and in particular to FIG. 1, a circuit in accordance with the present invention is indicated generally by the reference numeral 10. In the circuit 10, an input terminal in the form of an expanded metal contact 12 is connected through a resistance 14 to the gate of a P-channel MOS transistor 16. The gate of the MOS transistor 16 is connected through the base-emitter circuits of bipolar NPN transistors 18 and 20 to ground. The collectors of the bipolar transistors 18 and 20 are also connected to ground.

Figures 2, 5:
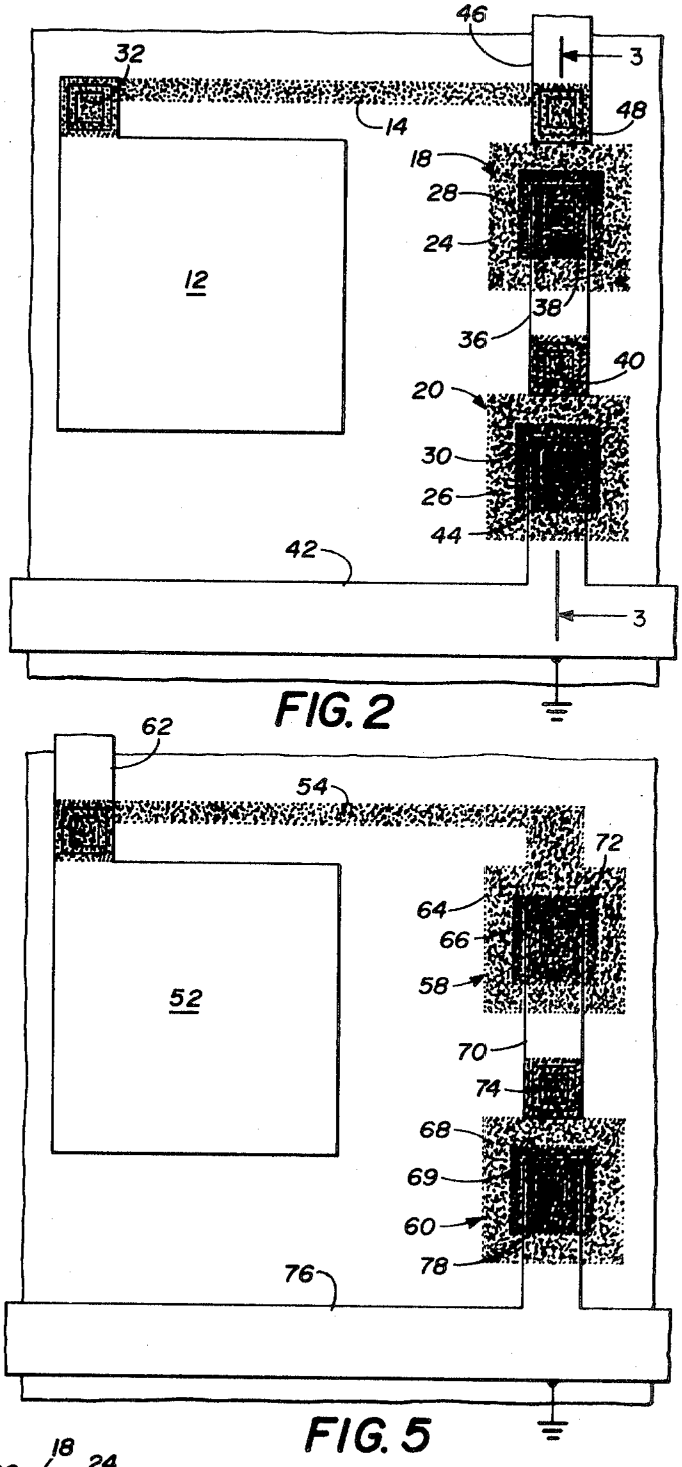
FIG. 2 is a plan view of a portion of an integrated circuit embodying the circuit of FIG. 1.
FIG. 5 is a plan view of a portion of an integrated circuit embodying the circuit of FIG. 4.
Figure 3:
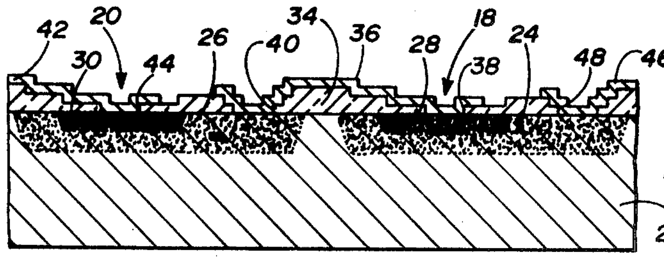
FIG. 3 is a sectional view taken substantially on lines 3—3 of FIG. 2.

The circuit 10 is implemented in the integrated circuit shown in the partial plan view of FIGS. 2 and 3. The integrated circuit is typically formed on an N-type silicon substrate 22. The bases of the bipolar transistors 18 and 20 are formed by P-type diffused regions 24 and 26 which are made during the same diffusion step as used to form the source and drain regions of the MOS transistors of the circuit. The P-type diffused source and drain regions for the MOS transistors of the integrated circuit are not illustrated in FIGS. 2 and 3 in order to conserve space, since the integrated circuit would typically employ hundreds or even thousands of MOS devices. Then more heavily doped N-type regions 28 and 30 are made into the P-type regions 24 and 26, respectively, to form the emitter regions of the bipolar transistors 18 and 20, respectively.

The diffusion 24 is extended to form the resistor 14. The input terminal 12 is an expanded metal contact which is electrically connected to one end of the diffused resistor 14 through an opening 32 in the layer of insulation, typically silicon oxide, overlying the substrate. The layer of insulation is indicated by the reference numeral 34 in FIG. 3. The emitter region 28 of the bipolar transistor 18 is connected to the base region 26 of the bipolar transistor 20 by a metal strip 36 which extends through openings 38 and 40 in the oxide layer 34 into contact with the respective regions. The emitter region 30 of bipolar transistor 20 is connected to a metal conductor 42 through an opening 44 in the oxide layer and the conductor 42 is connected to ground. A metal conductor 46 is connected to the diffused region 24 through an opening 48 in the oxide layer, and extends to the gate of the MOS transistor 16, which has been omitted from FIGS. 2 and 3 as mentioned.

The MOS transistor 16 is a P-channel device and is controlled by a voltage that swings from ground to a negative gate voltage. This negative control voltage reverse biases the base-emitter diode junctions of the NPN bipolar transistors 18 and 20. The reverse biased junctions permit the input voltage to swing negatively until the voltage at the gate of MOS transistor 16 exceeds approximately −14.0 volts. Then the base-emitter junctions of the bipolar transistors 18 and 20 conduct in the reverse direction in the manner of a Zener diode. The resistor 14 limits the current both to the gate of the MOS transistor 16, and particularly the current through the base-emitter circuits of the bipolar transistors 18 and 20 to protect all three of the devices against high current surges.

The arrangement of FIGS. 1–3 is satisfactory when the input capacitance to the circuit is small, as would be the case when a single gate of an MOS transistor is being driven. However, the resistance in series with the gate of the MOS input transistor may unduly slow switching when the input capacitance is large, as is the case where a large number of MOS gates are connected to the logic input.

Figure 4:
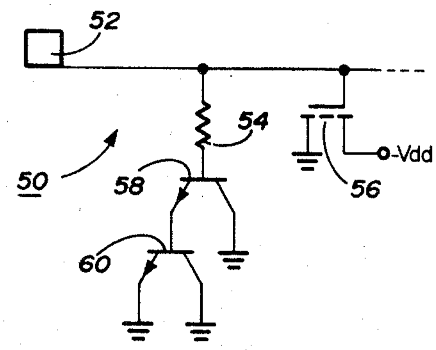
FIG. 4 is a schematic circuit diagram of another embodiment of the invention.

Another embodiment of the present invention suitable for use with circuits having high input capacitances is indicated generally by the reference numeral 50 in FIGS. 4 and 5. The circuit 50 is similar to the circuit 10 except that the input terminal 52 is connected directly to the gate of a P-channel MOS transistor 56, which is representative of any number of input MOS transistors. The gate of the MOS transistor 56 is connected through a resistor 54 and the base-emitter junctions of bipolar NPN transistors 58 and 60 to ground. The collectors of the bipolar transistors 58 and 60 are grounded. The circuit 50 is illustrated in the portion of the integrated circuit illustrated in FIG. 5. The circuit 50 is identical to the circuit 10 of FIG. 2 except for the point at which the gates of the MOS transistors are connected to the circuit. The expanded contact input terminal 52 is connected directly to the gates of the MOS transistors (not illustrated) by a conductor 62. The resistance 54 is part of the base diffusion 64 of the bipolar transistor 58. The emitter region 66 of bipolar transistor 58 is connected to the base region 68 by a metal strip 70 which extends through openings 72 and 74 in the oxide into contact with the diffused regions 66 and 68, respectively. The emitter region 69 of the bipolar transistor 60 is connected to ground by a conductor 76 which extends through an opening 78 into contact with the diffused emitter region 69.

The operation of the circuit 50 is substantially the same as that of the circuit 10 except that the resistance 54 is placed so as to limit the current to the diode junctions but not to the gates of the MOS transistor. In applications where the input voltage is to be applied to the gates of a large number of MOS transistors, placing the resistor 54 in series between the input terminal 12 and the gates would result in a slow operation because of the relatively large total input capacitance of the large number of gates. However, the resistor 54 can be placed in the series circuit from the gates of the MOS transistors through the base-emitter junctions of the bipolar transistors 58 and 60 to ground so as to protect the diodes from excessive current without slowing the rate at which the capacitance is charged.

Although the embodiments of the invention described utilize P-channel MOS transistors and NPN bipolar transistors formed on an N-type substrate, it is to be understood that the invention is equally applicable to N-channel MOS transistors and PNP bipolar transistors formed on a P-type substrate. Also, the term MOS transistor is intended to generically refer to any field effect device of the metal-insulator semiconductor type.

Although preferred embodiments of the invention have been described in detail, it is to be understood that various changes, substitutions, and alterations can be made therein without departing from the spirit and scope of the invention as defined by the appended claims.

What we claim is:

1. A semiconductor integrated circuit comprising: a semiconductor substrate of one conductivity type, a MOS transistor formed on said substrate including spaced source and drain regions of opposite conductivity type to subjacent material in said substrate and a gate electrode overlying the channel between said source and drain regions, a bipolar transistor in said substrate including base region of opposite conductivity type in said substrate and an emitter region of said one conductivity type in said base region forming base-emitter and collector-base PN junctions between said base region and said substrate and between said emitter region and said base region, an input electrical connection to said gate electrode and said base region and means electrically connecting said emitter region, said substrate subjacent to said base region and said source region together at substantially the same potential, said collector-base and base-emitter PN junctions acting as back to back reversed biased junctions when the input voltage is applied to said input electrical connections.

2. A semiconductor integrated circuit according to claim 1 including a current limiting resistance connected between said gate electrode and said input electrical connection.

3. A semiconductor integrated circuit according to claim 1 including a current limiting resistance connected between said input electrical connection and said base region.

4. A semiconductor integrated circuit comprising: a semiconductor substrate of one conductivity type, a MOS transistor formed on said substrate including spaced source and drain regions of opposite conductivity type to subjacent material in said substrate and a gate electrode overlying the channel between said source and drain regions, a plurality of bipolar transistors in said substrate each including a base region of opposite conductivity type in said substrate and an emitter region of said one conductivity type in its respective base region forming base-emitter and collector-base PN junctions between the base region and the substrate and between the emitter region and the base region, an input electrical connection to said gate electrode and to the base region of a first one of said bipolar transistors, the emitter of said first one of said bipolar transistors being connected to the base region of a second one of said bipolar transistors, and means electrically connecting the collectors of said bipolar transistors, the emitter of the last one of said bipolar transistors and said source region together at substantially the same potential, said emitter circuits of said bipolar transistors being reversed biased when the input voltage is applied said input electrical connection.

5. A semiconductor integrated circuit according to claim 4 including a current limiting resistance connected between said gate electrode and said input electrical connection.

6. A semiconductor integrated circuit according to claim 4 including a current limiting resistance connected between said input electrical connection and said base region.